United States Patent [19]

Kyrian

[11] Patent Number: 4,633,512
[45] Date of Patent: Dec. 30, 1986

[54] AMPLITUDE-MODULATED TRANSMITTER WITH CONTROLLED CARRIER VALUE

[75] Inventor: Bohumil Kyrian, Unterbözberg, Switzerland

[73] Assignee: BBC Brown, Boveri & Company Limited, Baden, Switzerland

[21] Appl. No.: 633,927

[22] Filed: Jul. 24, 1984

[30] Foreign Application Priority Data

Aug. 12, 1983 [CH] Switzerland ............. 4408/83

[51] Int. Cl.⁴ ........................................... H04B 1/02
[52] U.S. Cl. .................................... 455/108; 455/116; 332/31 R
[58] Field of Search ............ 455/116, 108, 109; 332/38, 31 R, 37 R; 381/102

[56] References Cited

U.S. PATENT DOCUMENTS 4,186,346 1/1980 Wysocki ............................ 455/108

FOREIGN PATENT DOCUMENTS 9254 3/1956 Fed. Rep. of Germany ........ 332/38
502013 3/1939 United Kingdom .

Primary Examiner—Jin F. Ng
Assistant Examiner—M. Huseman
Attorney, Agent, or Firm—Oblon, Fisher, Spivak, McClelland & Maier

[57] ABSTRACT

An amplitude-modulated transmitter wherein the carrier value (T) is controlled in accordance with an improved HAPUG (controlled-carrier) method. Increased energy saving with simultaneous increase of the signal-to-noise ratio at the reception site is achieved by controlling the carrier along a static characteristic (SK) which begins, with a decreasing modulation level (P), with a residual carrier value (R), drops with increasing modulation levels to a minimum carrier value ($T_{min}$) and passes into an ideal carrier-control characteristic only above a first level value ($P_1$). Additional dynamic control results in a reduction in cross-over distortions.

10 Claims, 5 Drawing Figures

AMPLITUDE-MODULATED TRANSMITTER WITH CONTROLLED CARRIER VALUE

BACKGROUND OF THE INVENTION

1. Field of the Invention

This invention relates to an amplitude-modulated transmitter in which a carrier value where carrier value is understood to refer generally to the level of the transmitted carrier signal and more particularly to the ratio of the actual carrier voltage or current divided by a maximum carrier voltage or current, respectively, is controlled by the modulation level which is understood to refer to the level of the modulating signal strength, i.e., the actual modulation signal amplitude divided by the maximum modulation signal amplitude.

2. Description of the Prior Art

For the purpose of reducing the power costs of an amplitude-modulated radio transmitter, and taking into consideration the receiver characteristics, a method for modulation with variable carrier value has been proposed quite early (Radio-Frequency Engineering and Electro-Acoustics, Jahrbuch der drahtlosen Telegraphie und Telephonie, volume 47, number 5, May 1936, page 141 and following). This method, known as HAPUG (controlled-carrier) modulation, provides linear control of the carrier value as a function of the level of the modulation signal which controls the carrier value forward from a residual carrier value at a modulation level of zero up to its maximum value at maximum modulation value. The residual carrier value limits the effect of a curved detector characteristic in the receiver on the quality of the demodulated radio signal.

On the basis of the HAPUG method it was furthermore been proposed (German Patent No. 3,037,902) to increase the energy saving by keeping the characteristic of the carrier control below the HAPUG characteristic, at least in the region of the most frequently occurring modulation levels whilst keeping the residual carrier value the same. In the extreme case, the carrier value then remains constant for lower modulation levels and identical to the residual carrier value and is forward-controlled only above a certain level value along the straight line resulting for a modulation percentage of 100%. In order to reduce the risk of over modulation, the steeper part of the characteristic can also be displaced in parallel towards smaller level values.

The two known methods for carrier control have one thing in common: a direct connection exists between the magnitude of the residual carrier value and the energy saving achieved. The smaller the residual carrier value selected, the greater the energy saving. On the other hand, the reduction of the residual carrier value is accompanied by a reduction in the signal-to-noise ratio at the reception site which leads to a noticeable deterioration in the quality of reception.

A weakening of the carrier to 60% of nominal amplitude (0.6 residual carrier value) as has been proposed in German Patent No. 3,037,902 is much too great for present and future conditions in the broadcast bands with their high density of transmitters. This reduces the signal-to-noise ratio by about 4.4 dB which represents an evident reduction in quality in the fringe areas of a service area especially during intervals and quiet passages of music. However, if the carrier is not reduced by as much, the desired energy saving is not achieved.

SUMMARY OF THE INVENTION

Carrier control technique which ensures optimum profitability of the transmitter and only insignificantly reduces the signal-to-noise ratio, as compared to a transmitter without carrier control, that is to say by about 3 dB at the most.

These and other objects are achieved by providing an amplitude-modulating transmitter in which a carrier value (T) is controlled by the modulation level (P), such that the static characteristic (SK) of the carrier value (T) varies as a function of the modulation level (P) between a maximum carrier value ($T_{max}$) and a minimum carrier value ($T_{min}$) which is greater than zero and the carrier value (T) on the static characteristic (SK) is forward-controlled proportionally to the modulation level (P) above a first level value ($P_1$), and wherein the minimum carrier value ($T_{min}$) occurs in the region of the most frequently occurring values of the modulation level (P), including means for controlling the carrier such that with a decreasing modulation level (P) there remains a residual carrier value (R) which is greater than the minimum carrier value ($T_{min}$), and means for controlling the carrier such that the carrier value (T) is initially reduced on the static characteristic (SK), starting from the residual carrier value (R), to the minimum carrier value ($T_{min}$) with rising modulation level (P).

The core of the invention consists in eliminating the fact that the minimum carrier value and the residual carrier value are identical and thus in breaking the direct connection between residual carrier value and energy saving. The energy saving is optimized in this manner by means of a minimum carrier value which is further reduced whilst the signal-to-noise ratio can be kept at an adequatly high level by means of an increased residual carrier value.

According to a preferred illustrative embodiment of the invention, the carrier value is reduced, on the static characteristic and starting from the residual carrier value, proportionally to the modulation level down to a second level value which is lower than the first value and is constant for modulation levels between the second level value and the first level value and is equal to the minimum carrier value.

In a preferred embodiment, the means for controlling the carrier contain a rectifier for rectifying the modulation signal, followed by a peak detector for measuring the peak value of the modulation signal and a control block which delivers, at an output, a control signal for controlling the carrier, as determined by the peak value of the modulation amplitude and in accordance with the static characteristic.

In order to reduce the crossover distortions and thus the spurious radiation in the event of a sudden increase in level, it is advantageous if the control block contains first means for reducing the carrier value from the residual carrier value to the minimum carrier value, second means for forward-controlling the carrier value for modulation levels above the first level value and third means for presetting the minimum carrier value and if the reduction in the carrier value by the first means takes place with a time delay with respect to the rise in modulation level.

Within the same context, it is also particularly advantageous, if the forward control of the carrier value by the second means takes place in dependence on the rise time of the modulation level in such a manner that, in deviation from the static characteristic, forward-control begins at modulation level values which are the lower, the shorter the rise time of the modulation level and that, with the shortest occurring rise times, the carrier value is directly forward-controlled from the residual carrier value.

This dynamic control system causes the abandonment of the static characteristic, for the purpose of reducing the crossover distortions, only when it is absolutely necessary and thus achieves an optimum energy saving with minimum distortions in the transmission.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
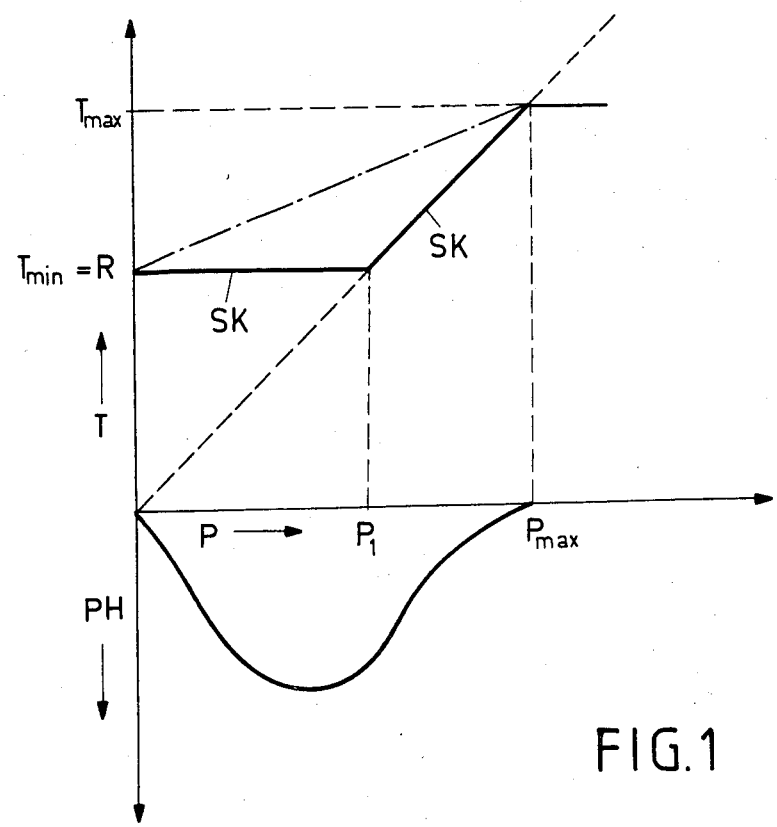
FIG. 1 is a graph illustrating the types of carrier control according to the prior art.

Referring now to the drawings, wherein like reference numerals designate identical or corresponding parts throughout the several views, in FIG. 1, the known types of carrier control are shown by means of their respective static characteristics. In the upper part of the diagram, the carrier value T is plotted as a function of the modulation level P, and in the lower part the level frequency PH is plotted as a function of the modulation level (P). The level frequency curve shown in the lower part of FIG. 1 specifies the average distribution of the modulation level as measured for a radio program over a prolonged period. Without carrier control, the carrier value T has a constant maximum value $T_{max}$. The static characteristic corresponds to the horizontal line, drawn in dashes, with a distance of $T_{max}$ from the ordinate. With an ideal carrier control which ignores disturbances and receiver characteristics, the static characteristic is represented by a straight line through the origin and the point with the maximum carrier value $T_{max}$ and the level value for $T_{max}$, $P_{max}$. In the reduced plot of $T/T_{max}$ over $P/P_{max}$, this straight line has a slope of 1.

The HAPUG method which, in contrast, does take into consideration the receiver characteristics (non linear detector characteristic), controls the carrier value T along the dot-dashed characteristic which starts as a straight line from a residual carrier value R at P=0 and also touches the point ($P_{max}$, $T_{max}$). Whereas in the case of the ideal carrier control, the modulation percentage is always 100%, it increases on the HAPUG characteristic with increasing level value and reaches the full value of 100% only at $P_{max}$. Between the two characteristics is the region in which, as compared with the HAPUG method, further energy savings can be achieved in the transmitting operation by reducing the carrier value T.

The static characteristic SK of the improved carrier control system of German Patent No. 3,037,902 is composed in the extreme case of a horizontal lower part and an upper part which follows the ideal carrier-control characteristic. This static characteristic SK is shown as a continuous line in FIG. 1. As in the HAPUG method, the residual carrier value R issimultaneously the minimum carrier value $T_{min}$ adopted during transmitting operation.

The horizontal part of the static characteristic SK reaches from the modulation level P=0 to a first level value $P_1$ and thus covers a range in which the level frequency PH (lower part of FIG. 1) is greatest. The level frequency curve specifies the average distribution of the modulation levels as measured for a radio program over a prolonged period.

Figure 2:
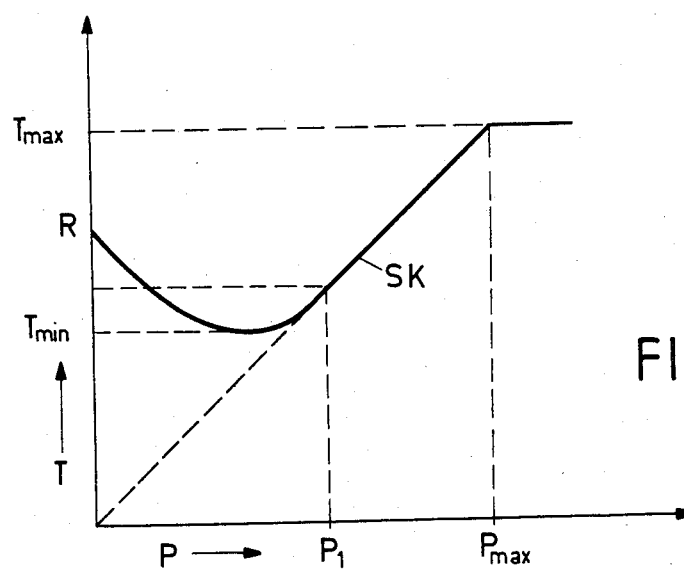
FIG. 2 is a graph illustrating the carrier control system according to the invention with the general shape of the static characteristic.

In FIG. 2, the static characteristic SK is shown in a diagrammatic plot corresponding to FIG. 1 which characteristic describes the carrier control according to the invention in a general form. The part of the characteristic between the first level value $P_1$ and the point ($P_{max}$, $T_{max}$) is again a part of the ideal carrier-control characteristic passing through zero. In this context, it must be expressly noted that the real magnitude of the first level value $P_1$ deviates in the control system according to the invention from the value known from the prior art and is generally smaller than this latter value.

Below the first level value $P_1$, the static characteristic SK is flatter and finally passes through a minimum with the associated minimum carrier value $T_{min}$ in the region of the most frequently occurring level values. In contrast to the prior art, however, this minimum carrier value $T_{min}$ is not maintained to P=0 but the static characteristic SK rises, after passing through $T_{min}$, with a negative slope to a residual carrier value R which is clearly greater than $T_{min}$. The main advantage of this shape of the characteristic according to the invention results from the decoupling of the variables R and $T_{min}$. As a result of this decoupling, the residual carrier value R which decisively affects the signal-to-noise ratio at the reception site, can be optimised, that is to say increased, largely independently of the minimum carrier value $T_{min}$ whilst, on the other hand, the minimum carrier value $T_{min}$ linked with the energy saving can be appropriately reduced as compared with the known method.

As is shown clearly by a comparison of the curve of the characteristic from FIG. 2 with the function PH(P) from FIG. 1, the static characteristic SK according to the invention is approximately the inverse of the frequency distribution of the modulation levels P so that the carrier value T is lowest precisely for those level values occurring most frequently during a normal radio program and rises only in those regions in which the achievable energy saving is low in any case.

The static characteristic SK in its general form according to FIG. 2 is shown as a curve which is continuous both itself and in its first derivation. Such a curve can be approximated by a variety of linear, superimposed static characteristic section. For each of these characteristic sections a separate function generator is then required which generates an output function, the slope and position of which can be adjusted. However, since small changes in the shape of the static characteristic (for example points of discontinuity in the first derivative) have only a minor influence on the integral energy saving, it is of advantage to confine the approximation of the curve according to FIG. 2 to a few sections of the characteristic and thus to keep the circuit-engineering effort for the control system within limits.

Figure 3:
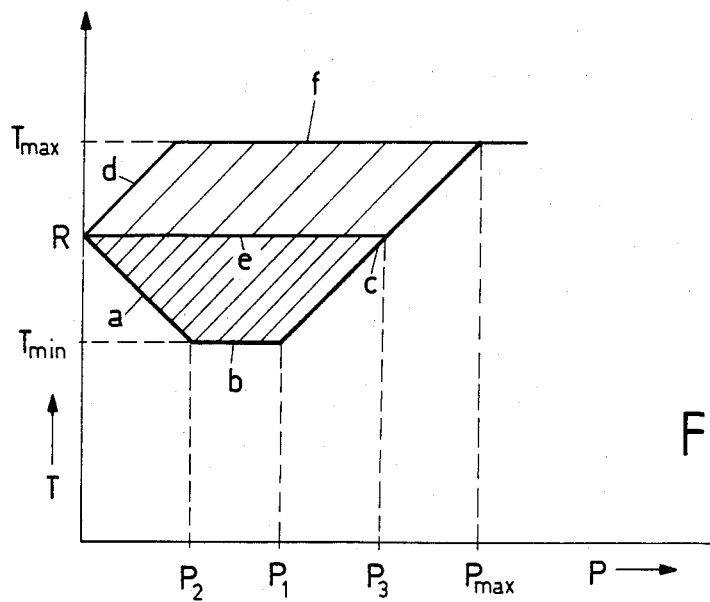
FIG. 3 is a graph illustrating a preferred embodiment of the static characteristic according to the invention and the range of dynamic control.

Preferably, for the approximation as shown in FIG. 3, three linear characteristic sections a, b and c are used, of which the first (a) passes with a negative slope from point (P=0, R) to a point (P$_2$, T$_{min}$) which has as coordinates a second level value P$_2$ and the minimum carrier value T$_{min}$. The second characteristic section b, having a slope O, joins the two points (P$_2$, T$_{min}$) and (P$_1$, T$_{min}$). The third characteristic section c, finally, is located in the normal manner along the ideal carrier-control characteristic between the points (P$_1$, T$_{min}$) and (P$_{max}$, T$_{max}$) of the P/T diagram.

Together, the three linear characteristic sections a, b and c form the static characteristic SK in the preferred embodiment of FIG. 3. It is particularly advantageous if the value of the slope of the first characteristic section a corresponds to that of the slope of the third characteristic section c, that is to say, assumes a value of −1 in the reduced plot. In this case, the sum of the carrier value T and the modulation levels P is constant in the region of the first characteristic section a so that a constant signal-to-noise ratio is produced precisely in this critical region of low level values.

As has already been described in detail, the carrier control system according to the invention allows a separate optimization of the residual carrier value R and of the minimum carrier value T$_{min}$. It has been found to be particularly advantageous for the operation of the transmitter if the residual carrier value R is selected to be approximately equal to 0.75 times the maximum carrier value T$_{max}$ and the minimum carrier value T$_{min}$ is selected to be approximately equal to 0.5 times the maximum carrier value T$_{max}$.

Figure 4:
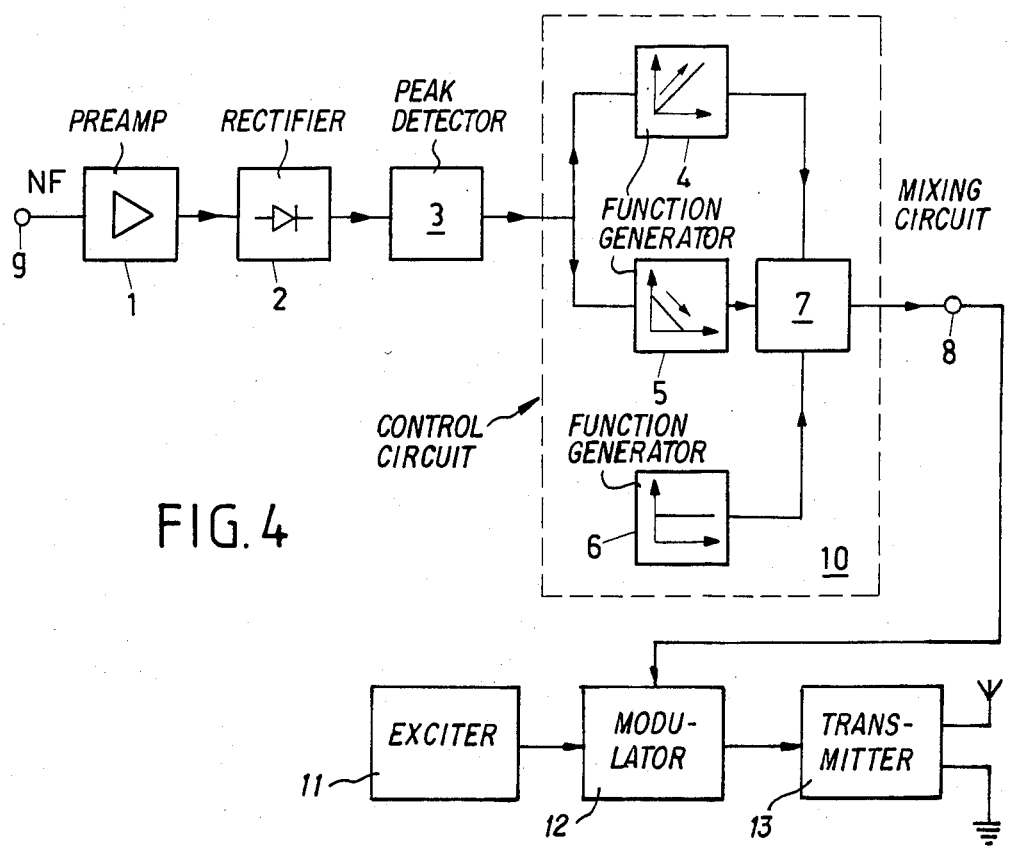
FIG. 4 is a block diagram of an illustrative embodiment of the carrier control according to the invention, including a control block.

The block diagram of an illustrative embodiment of the carrier control system according to the invention is shown in FIG. 4. The modulation signal is applied in the form of a low frequency signal NF to a low-frequency input 9 and, via a preamplifier 1, reaches a rectifier 2 which can be formed in a known manner as a two-way rectifier. The rectifier 2 converts the low-frequency alternating-voltage signal into a pulsating direct-voltage signal which is passed onto the input of a peak detector 3. The peak detector 3 forms an output signal from the pulsating direct-voltage signal, the variation with time of which corresponds to the envelope curve of the original modulation signal. An adjustable time constant within the peak detector 3 provides equalization for extremely short-period drops in the modulation levels P.

The output signal of the peak detector 3 is supplied to a control circuit 10 which contains three function generators 4, 5 and 6 and a mixing circuit 7. The function generators generate the characteristic sections a, b and c, drawn in FIG. 3, of the static characteristic which are then mixed, matched to each other in position and slope, in the mixing circuit 7 in such a manner that the shape of the static characteristic is produced at the output 8 of the control circuit 10. A control signal is taken from the output 8 and applied to an input of modulator 12 driver by exciter 11. The output of modulator 12 is applied to the transmitter 10, and the carrier value T is controlled proportionally to the control signal at the output 8. The transfer characteristic of the control circuit 10 thus directly corresponds to the T(P) curve of the carrier control system.

The first function generator 4 has the transfer function of a linear non-inverting amplifier, that is to say it provides at its output a signal which is proportional to the signal of the peak detector 3. It thus contributes to the static characteristic of that characteristic section which corresponds to the ideal carrier-control characteristic, that is to say the third characteristic section c.

The second function generator 5 has the transfer function of a linear, inverting amplifier the output signal of which, however, is displaced by a constant positive value which is assumed for a disappearing input signal. This second function generator 5 contributes the first characteristic section a to the static characteristic of FIG. 3. The constant, positive displacement of its output signal corresponds to the residual carrier value R.

In contrast to the other two function generators 4 and 5, the third function generator 6 is not driven by the peak detector 3. It only supplies a constant and adjustable output signal which is independent of the envelope curve of the modulation signal and which is used for presetting the minimum carrier value T$_{min}$ in accordance with the characteristic section b.

The output signals of the three function generators 4, 5 and 6 are mixed in the mixing circuit 7 in such a manner that, in dependence on the modulation levels P between P=0 and P=P$_2$, only the second function generator 5, between P=P$_2$ and P=P$_1$ only the third function generator 6 and above P$_1$ only the first function generator 4 contribute to the control of the carrier value T. A mixing circuit having these characteristics can be implemented, for example, by a change-over switch controlled by the modulation level P.

The previous statements on the novel carrier control system in an amplitude-modulated broadcast transmitter are restricted to the static characteristic as expressed in FIG. 2 and in the characteristic sections a, b and c of FIG. 3. According to a further development of the invention, in addition to this static carrier control system which does not take into consideration the different rise and fall times of the modulation levels P, a dynamic carrier control system is introduced which, starting from the static characteristic, departs from this characteristic with more rapid changes of the modulation level and forward-controls the carrier value T in each case in such a manner that crossover distortions and thus spurious radiation are largely prevented even with steep rises in level.

For this purpose, the reverse control according to the first characteristic section a is delayed in time with respect to the envelope-curve signal from the peak detector 3. This is done, for example, by a timing section built into the second function generator 5. If the rise in level then occurs with a time constant which is clearly less than the time constant of this timing section, the function generator 5 no longer responds in the range of level values allocated to it. Reverse control is no longer initiated because, after the delay time has elapsed, the modulation levels P is already above the second level value P$_2$ and thus in the region of another characteristic section.

In a corresponding embodiment of the mixing circuit 7, the internal delay in the second function generator 5 leads, for example, to a dynamic characteristic section e as plotted in FIG. 3 as a horizontal line through the point (Q,R). For this purpose, the mixing circuit 7 must be designed in such a manner that of the three output signals, it is always the greatest output signal from the respective function generator which is passed onto the output 8.

If the modulation levels P are very rapidly increased from P=0 to a third level value $P_3$, because of the internal time delay in the function generator 5 the output signal corresponding to the residual carrier value R and having the greatest value of all output signals within the level range Q-$P_3$ is present at the output 8. With a further increase in the modulation level beyond $P_3$, this output signal is replaced by the then greater output signal of the first function generator 4 which forward-controls the carrier in accordance with the characteristic section c. In this dynamic control system, the output signal of the third function generator 6 is lower than the other output signals, for all modulation levels, and accordingly is not taken into consideration in the mixing circuit 7. In this case, the carrier value T is forward-controlled along the dynamic characteristic section e and further to the third characteristic section c of the static characteristic.

If the steep rise in modulation level P does not take place from P=0 but from a level value lying between P=0 and $P_2$, a curve section results which is parallel to but deeper than the characteristic section e so that in this type of dynamic control the total area, shown closely hatched in FIG. 3, between the characteristic sections a, b, c and e is available for carrier control, in dependence on the output level and the steepness of the rise. The partial bridging of the areas of the carrier value T which are allocated to the static characteristic sections a, b and c decisively reduces the crossover distortions which would otherwise arise with a steep rise in level and a carrier control along the static characteristic.

According to a further development of the invention, a further reduction in crossover distortions can be achieved by the fact that with the shorter rise times occurring in the modulation levels P, the carrier value T is forward-controlled not just at level values between $P_1$ and $P_{max}$ but even at a lower modulation level. In the limit case of the shortest rise times occurring, the carrier value T is raised along the dynamic characteristic sections d and f from FIG. 3. With dynamic control, this also makes available the single-hatched area under the characteristic from FIG. 3, in addition to the double-hatched area. The two limit cases of the slow and the very fast level change are characterised by the static characteristic with the charactersitic sections a, b and c and by the dynamic characteristic sections d and f, respectively.

Figure 5:
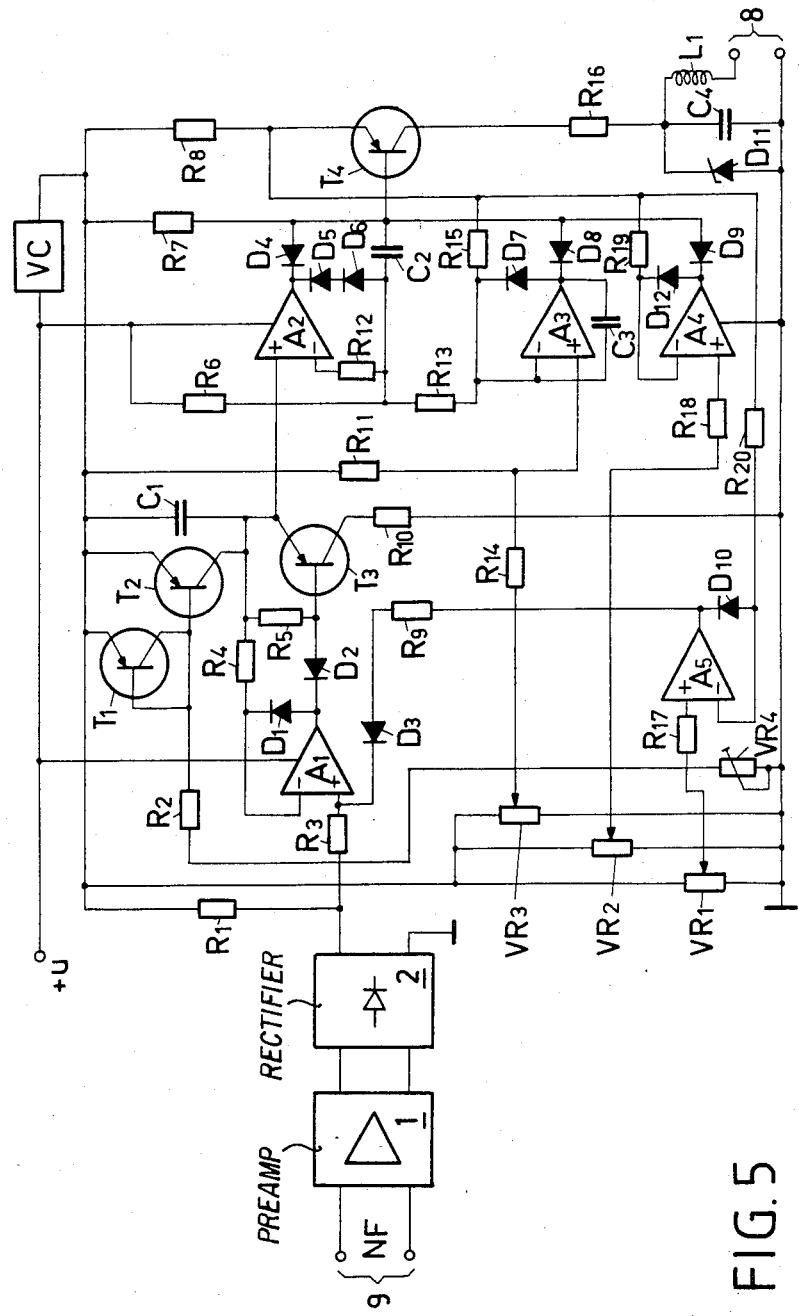
FIG. 5 is a circuit diagram of a preferred embodiment of a circuit of the control block according to FIG. 4.

A preferred embodiment of the control block 10 is shown in FIG. 5. In this illustration, the preamplifier 1 and the rectifier 2 are shown only as function blocks because they can be implemented in known manner and without difficulties by the expert. The peak detector 3 from FIG. 4 is constructed from a differential amplifier A1 provided with the appropriate bias resistors R1 and R3 which, as a voltage follower, charges up, via diodes D1 and D2, resistors R4 and R5 and a transistor T3, a capacitor C1 to the peak voltage of the pulsating direct voltage from the rectifier 2. The capacitor C1, which operates as a peak-value store, is discharged via a known currentmirror circuit including transistors $T_1$ and $T_2$ having a time constant which can be predetermined via a bias resistor R2 by means of an adjustable resistor VR4.

The peak value or envelope-curve value stored in the capacitor C1 is taken from the emitter of the transistor T3 and fed to the non-inverting input of a first differential amplifier A2 which is provided with feedback via diodes D5 and D6 and a resistor R12. The first differential amplifier A2 handles the task of the first function generator 4 from FIG. 4 and operates as a non-inverting amplifier for generating the static characteristic section c.

The output signal of the first differential amplifier A2 is fed via a resistor R13 to the inverting input of a second differential amplifier A3 which is connected as an inverting amplifier. It handles the task of the second function generator 5 by producing a mirror image of the characteristic section, generated by the first differential amplifier A2, at the x axis. The necessary displacement of this mirrored characteristic by a constant amount is achieved by a constant bias voltage at the non-inverting input of the second differential amplifier A3 which can be set by means of a voltage divider VR3 via resistors R11 and R14.

The function of the third function generator 6 is fulfilled by a third differential amplifier A4 connected as a voltage follower, the input voltage of which is preset by means of a voltage divider VR2 via a resistor R18.

The mixing circuit 7 for mixing the output signals of the three function generators 4, 5 and 6 or of the three differential amplifiers A2, A3 and A4, respectively, comprises three diodes D4, D8 and D9 which are connected from the outputs of the differential amplifiers to a common summing point and from there drive the base of a transsistor T4 which generates the control signal available at the output 8 for controlling the carrier.

Together with the diodes D4, D8 and D9, the differential amplifiers A2, A3 and A4 represent the desired function network by means of which the static characteristic is composed of the linear characteristic sections a, b and c. The dynamic control in the hatched area from FIG. 3 is achieved by two capacitors C2 and C3 which are connected in a special manner to the differential amplifiers A2 and A3.

The capacitor C2 is in parallel to the diode D4 which connects the output of the differential amplifier A2 to the summing point. Whilst without C2, the output signal from A2 is passed to the transistor T5, connected as a current source, only when it is greater than the output signals from the other two differential amplifiers A3 and A4, the capacitor C2 shorts out the blocking diode D4 to a greater or lesser extent with a steep rise in the modulation level T so that in this case the forward-control of the carrier value T begins even below the first level value $P_1$.

The capacitor C3 is located in the feedback line of the second differential amplifier A3 and causes the time delay in the reverse control with respect to the modulation level P. In a tested embodiment of the circuit according to FIG. 5, a capacitor C2 having a capacity of 0.22 μF was used which corresponds to a characteristic rise time of about 2 ms. For the capacitor C3, a capacity value of 47 nF in conjunction with a resistance R13 of 100 kΩ proved to be especially advantageous. In the peak detector circuit 3, good results were achieved with a capacitor C1 of 1 μF at a 100Ω collector resistance R10 for the transistor T3. Type BCY 798 pnp transistors were used as transistors T1-T4.

To limit overdriving, a limiter essentially consisting of a further differential amplifier A5 is additionally provided in the circuit according to FIG. 5. An adjustable reference voltage tapped off a voltage divider VR1 is applied to the non-inverting input of the differential amplifier A5 via a resistor R17. The inverting input is connected via resistors R20, R19 and R15 and diodes D7 and D12 to the outputs of the second and third differential amplifier A3 and A4, respectively. The output of A5, fed back via a diode D10, leads via a resistor R9 and a further diode D3 to the non-inverting input of the differential amplifier A1 in the peak detector 3.

In order to protect the circuit from radio-frequency interference from the transmitter stage, an RF trap consisting of an inductance L1 of about 33 uH and a capacitor C4 having a capacity of about 10 nF is provided in the collector line of the transistor T4. The RF trap is additionally bridged by a Zener diode D11 in order to ensure that the circuit is operational independently of the impedence applied to the output 8. Finally, a voltage regulator, for example of the type LM 317, can be inserted into the supply line for the supply voltage U in order to increase the accuracy of the control system.

Obviously, numerous modifications and variations of the present invention are possible in light of the above teachings. It is therefore to be understood that within the scope of the appended claims, the invention may be practiced otherwise than as specifically described therein.

What is claimed as new and desired to be secured by Letters Patent of the United States is:

1. An amplitude-modulating transmitter having a control system, comprising:
   a plurality of means for varying a carrier value (T) along a static characteristic (SK) as a function of modulation levels (P) between a maximum carrier value ($T_{max}$) and a minimum carrier value ($T_{min}$) which is greater than zero and occurs in a region of the most frequently occurring values of the modulation levels (P), said plurality of means comprising,
   first means for forward-controlling said carrier value (T) along said static characteristic proportionally to said modulation levels (P) above a first modulation level value ($P_1$),
   second means for controlling the carrier such that with vanishing modulation levels (P), there remains a residual carrier value (R) which is greater than said minimum carrier value ($T_{min}$), and
   third means for controlling the carrier such that said carrier value (T) is initially reduced along said static characteristic (SK), with increasing modulation levels (P), starting from said residual carrier value (R), to said minimum carrier value ($T_{min}$).

2. A transmitter according to claim 1, wherein said third means comprises:
   means for reducing said carrier value (T), starting from said residual carrier value (R), proportionally to said modulation levels (P) for all modulation levels below a second modulation level value ($P_2$) which is lower than said first modulation level ($P_1$), and
   means for maintaining said carrier value (T) constant and equal to said minimum carrier value ($T_{min}$) for all modulation levels (P) between said second and said first modulation levels ($P_2$, $P_1$).

3. A transmitter according to claim 2, wherein the static characteristic (SK) has slopes equal in amount below the second modulation level value ($P_2$) and above the first modulation level value ($P_1$).

4. A transmitter according to claim 1, wherein the residual carrier value (R) is approximately equal to 0.75 times the maximum carrier value ($T_{max}$), and the minimum carrier value ($T_{min}$) is approximately equal to 0.5 times the maximum carrier value ($T_{max}$).

5. A transmitter according to claim 1, wherein said plurality of means comprises:
   a rectifier for rectifying the modulation signal,
   a peak detector, which follows said rectifier, for measuring the peak value of said rectified modulation signal, and
   a control circuit which supplies at an output a control signal for controlling said carrier value as determined by said peak value and in accordance with said static characteristic (SK).

6. A transmitter according to claim 5, wherein the control circuit comprises:
   a function network having plural differential amplifiers, including a first differential amplifier constructed in a non-inverting arrangement for forward-controlling, a second differential amplifier, following said first differential amplifer in inverting arrangement and constructed for lowering carrier value, and a third differential amplifier constructed as a voltage follower for presetting the minimum carrier value ($T_{min}$), and
   a mixing circuit for mixing the output signals of the first, second and third differential amplifiers for forming the static characteristic (SK).

7. A transmitter according to claim 1, wherein said third means comprises:
   means for carrying out said reduction of said carrier value (T) with a time delay with respect to said increase of said modulation levels (P).

8. A transmitter according to claim 7, wherein said mixing circuit comprises:
   a plurality of diodes connected to a common summing point, said diodes also connected to respective outputs of said differential amplifiers,
   a first capacitor by-passing the diode of said first differential amplifier at higher frequencies, and
   a second capacitor signal feedback from the output of said second differential amplifer to its inverting input.

9. A transmitter according to claim 8, wherein the first capacitor has a capacitor of aproximately 0.2 $\mu F$ and the second capacitor has a capacitor of approximately 50 nF.

10. A transmitter according to claim 1, wherein said first means comprises means for forward-controlling said carrier value (T) depending on how fast said modulation levels (P) increase, in such a way that, deviating from said static characteristic (SK), said forward control starts at values of said modulation levels (P) which are lower than said first modulation level value ($P_1$) and which decrease with an increase of said modulation level fastness, whereby said carrier value (T) is directly forward-controlled from said residual carrier value (R), if said increase of said modulation levels (P) reaches its maximum fastness.

* * * * *